(12) United States Patent
Takagi et al.

(10) Patent No.: US 9,638,723 B2
(45) Date of Patent: May 2, 2017

(54) STATUS ESTIMATION APPARATUS, STATUS ESTIMATION METHOD

(71) Applicant: Kabushiki Kaisha Toshiba, Minato-ku (JP)

(72) Inventors: Yasuo Takagi, Chigasaki (JP); Kyosuke Katayama, Asaka (JP); Kazuto Kubota, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 56 days.

(21) Appl. No.: 14/031,827

(22) Filed: Sep. 19, 2013

(65) Prior Publication Data

US 2014/0100805 A1    Apr. 10, 2014

Related U.S. Application Data

(63) Continuation of application No. PCT/JP2013/070221, filed on Jul. 20, 2013.

(30) Foreign Application Priority Data

Oct. 4, 2012  (JP) .................. 2012-222469

(51) Int. Cl.
  *G01R 19/00*  (2006.01)
  *G01R 19/25*  (2006.01)
  *H02J 13/00*  (2006.01)

(52) U.S. Cl.
  CPC ..... *G01R 19/0007* (2013.01); *G01R 19/2513* (2013.01); *H02J 13/0075* (2013.01);
  (Continued)

(58) Field of Classification Search
  CPC ............. G01R 19/0007; G01R 19/2513; H02J 13/0075
  See application file for complete search history.

(56) References Cited

U.S. PATENT DOCUMENTS 6,795,789 B2 *   9/2004  Vandiver .................... 702/122
2011/0251807 A1 * 10/2011  Rada et al. .................. 702/61
(Continued)

FOREIGN PATENT DOCUMENTS

GB          2465367       5/2010
JP       2000-292465     10/2000
(Continued)

OTHER PUBLICATIONS

Islam et al., 'Identification of Harmonic Sources in Power Distribution Systems', 1997, IEEE Publication, pp. 301-303.*

(Continued)

*Primary Examiner* — Elias Desta
(74) *Attorney, Agent, or Firm* — Oblon, McClelland, Maier & Neustadt, L.L.P.

(57) ABSTRACT

According to an embodiment, a status estimation apparatus includes detector, calculator, estimator and specifying unit. Detector detects a status change of any of electrical devices based on measurement data of a current flowing in a distribution line supplies power to the devices. Calculator calculates a current waveform change and a power change associated with the status change based on the measurement data. Estimator estimates a candidate originating from the status change based on the current waveform change. Specifying unit specifies a device caused the status change and a type of the status change based on the power change and an estimation result of the candidate.

16 Claims, 10 Drawing Sheets

(52) U.S. Cl.
CPC ....... *Y02B 70/3266* (2013.01); *Y02E 60/7853* (2013.01); *Y04S 20/242* (2013.01); *Y04S 40/126* (2013.01)

(56) References Cited

U.S. PATENT DOCUMENTS

| | | | |
|---|---|---|---|
| 2012/0022797 A1* | 1/2012 | Maruyama et al. | 702/34 |
| 2012/0080949 A1* | 4/2012 | Gelonese | 307/31 |

FOREIGN PATENT DOCUMENTS

| | | |
|---|---|---|
| JP | 2002-152971 | 5/2002 |
| JP | 2010-57329 | 3/2010 |
| JP | 2002-152971 | 1/2011 |
| JP | 2011-22156 | 2/2011 |
| JP | 2011-227545 | 11/2011 |
| WO | WO 2011/002735 A1 | 1/2011 |

OTHER PUBLICATIONS

International Search Report issued Oct. 15, 2013 in PCT/JP2013/070221(English Translation only).

European Search Report issued Apr. 16, 2016 in corresponding European Application No. 13815668.2 (11 pages).

International Search Report and Written Opinion issued Oct. 15, 2013 in Application No. PCT/JP2013/070221(With English Translation of Category of Cited Documents).

European Search Report issued Apr. 22, 2016 in corresponding European Application No. 13815668.2 (11 pages).

Kasun Nanayakkara O M K et al., "Traveling-Wave-Based Line Fault Location in Star-Connected Multiterminal HVDC Systems", IEEE Transactions on Power of Delivery, vol. 27, No. 4, Oct. 2012, (9 pages).

\* cited by examiner

Home appliance operations

FIG. 12A

Discrete Wavelet Coefficients

FIG. 12B

Continuous Wavelet Coefficients

FIG. 12C

STATUS ESTIMATION APPARATUS, STATUS ESTIMATION METHOD

CROSS-REFERENCE TO RELATED APPLICATION

This application is a Continuation application of PCT Application No. PCT/JP2013/070221, filed Jul. 25, 2013 and based upon and claiming the benefit of priority from prior Japanese Patent Application No. 2012-222469, filed Oct. 4, 2012, the entire contents of all of which are incorporated herein by reference.

FIELD

Embodiments described herein relate generally to a load survey technique of surveying, for example, the breakdown of power consumption in houses.

BACKGROUND

With the recent growing awareness of environmental preservation and concern about power shortage, a great deal of attention has been paid to a technique of managing energy consumption in houses, buildings, condominiums, and communities. For example, a house is equipped with so-called home appliance devices such as lighting, air conditioners, and a refrigerator. Recently, an increasing number of houses are equipped with a dispersed power system such as a PV (Photovoltaic Power Generation) system, FC (Fuel Cell), or storage battery. A HEMS (Home Energy Management System) is a system for managing energy consumption of these electrical devices.

For example, visualizing the consumption amount of energy in real time can induce consumers to have "awareness". This is very effective in energy saving. That is, the first step in energy management is to monitor the statuses of electrical devices. To implement this, it is conceivable to attach a measuring device (sensor) to an outlet or make an electrical device itself have a function of measuring the consumption amount of energy.

However, it takes much cost to attach a measuring device to each outlet and requires much labor to construct a communication means for data acquisition. Although makers have begun to provide electrical devices having measuring devices, most of the existing electrical devices do not have such a function. Demands have arisen for a technique of monitoring the statuses of electrical devices, which can be widely applied to existing electrical devices at low cost.

There is available a technique of monitoring the statuses of electrical devices based on harmonic analysis results on current waveforms or voltage waveforms obtained by a power sensor provided for a power feeder in a house. However, the harmonic generated from an electrical device fluctuates depending on the load, and hence it is difficult to specify the electrical device from a harmonic component. One of the major reasons for this is that an increasing number of home appliance devices (inverter facilities) including inverters in power supply circuits. Inverter facilities include rectifying circuits. Owing to control by a rectifying circuit, the amount and waveform of a current required change in accordance with the load.

That is, the existing method of specifying an electrical device at work based on harmonic analysis results on a mixture of waveforms from various electrical devices includes large errors. The power consumption amount estimated based on a specified electrical device therefore includes a large error. That is, the existing method may include a large estimation error in a power consumption amount and specify a wrong electrical device, thus lacking in reliability.

DETAILED DESCRIPTION

In general, according to an embodiment, a status estimation apparatus includes a detection unit, a calculation unit, an estimation unit, and a specifying unit. The detection unit detects a status change of any of a plurality of electrical devices based on measurement data of a current flowing in a distribution line which supplies power to the plurality of electrical devices. The calculation unit calculates a current waveform change and a power change which are associated with the status change based on the measurement data. The estimation unit estimates a candidate originating from the status change based on the current waveform change. The specifying unit specifies an electrical device which has caused the status change and a type of the status change based on the power change and an estimation result of the candidate.

Figure 1:
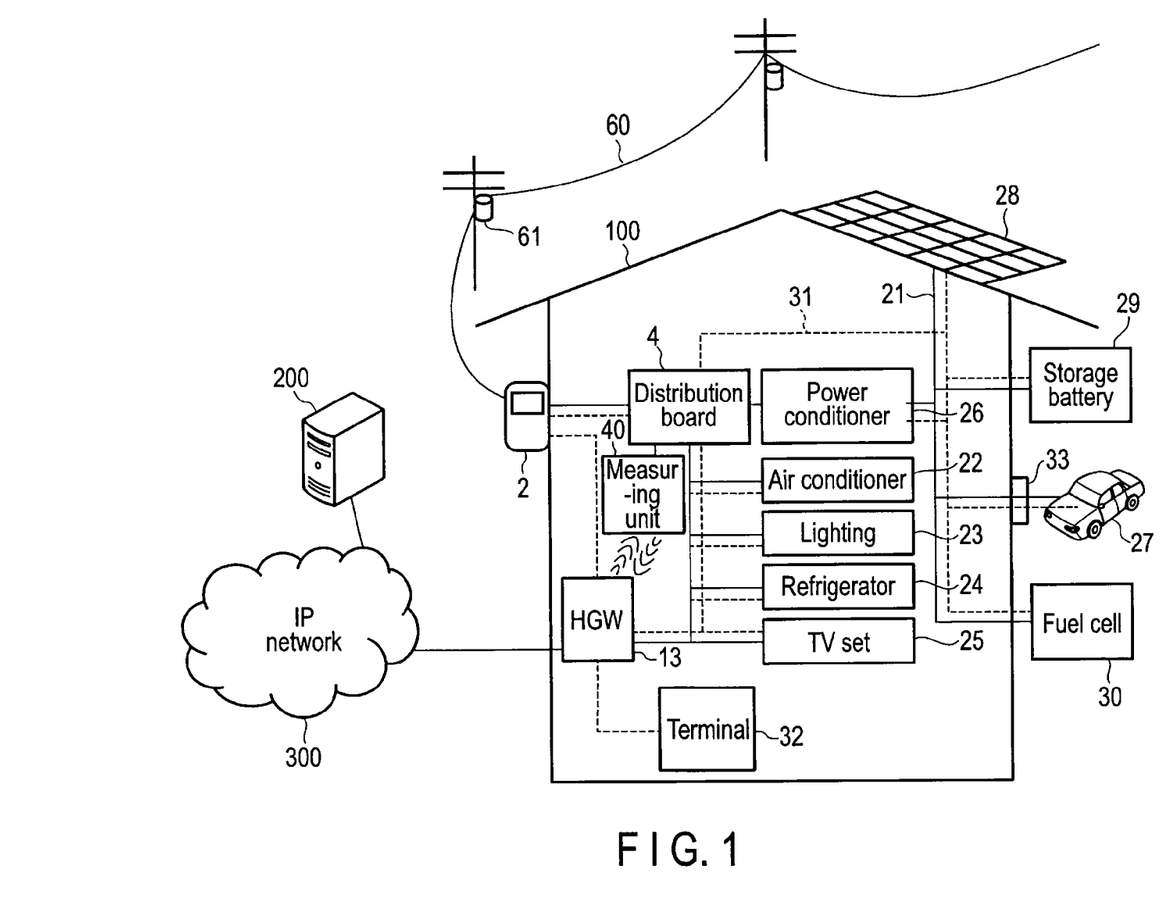
FIG. 1 is a view showing an example of an energy management system to which a status estimation apparatus according to an embodiment can be applied.

FIG. 1 shows an example of an energy management system to which a status estimation apparatus according to an embodiment can be applied. Referring to FIG. 1, the commercial power supplied from a power grid 60 is distributed to each house via a transformer 61 on a pole 61 and is connected to a distribution board 4 of a customer's house (home) 100 via an electrical energy meter 2 such as a smart meter. The electrical energy meter 2 measures the electrical energy generated by a renewable energy generation system of the home 100, the electrical energy consumed by the home 100, the electrical energy flowing from the power grid 60, or the electrical energy flowing reverse to the power grid 60 and so on.

A distribution line 21 is formed as a distribution system of the home 100. The distribution board 4 supplies power to electrical devices (an air conditioner 22, a lighting 23, a refrigerator 24, a TV set 25, and the like (including an HP (heat pump water heater) (not shown))) and a power conditioner (Power Conditioning system: PCS) 26 via the distribution line 21. That is, electrical devices are devices connected to the distribution line 21, and mean all devices which consume power, generate power, and consume and generate power, including an EV (Electrical Vehicle) 27 and a PV system 28. Note that the distribution board 4 may include a measuring device for measuring electrical energy for each feeder.

Solar panels are installed on the roof and outer walls of the building of the home 100 to form the PV system 28. The DC power generated by the PV system 28 is supplied to the power conditioner 26. The power conditioner 26 supplies this DC power to a storage battery 29 to charge the storage battery 29 as an electrical storage device installed in the home 100.

The power conditioner 26 includes a converter (not shown) and supplies AC power from the distribution line 21 to the storage battery 29 upon converting the power into DC power. This makes it possible to charge the storage battery 29 by using late-night power or the like. The power conditioner 26 further includes an inverter (not shown) and applies the AC power supplied from the storage battery 29 or a fuel cell 30 to the distribution line 21 upon converting the power into AC power. This allows each device connected to the distribution line 21 to receive power (self-supplied power) from the storage battery 29 or the fuel cell 30.

That is, the power conditioner 26 has a function as a power converter for exchanging energy between the storage battery 29, the fuel cell 30, and the distribution line 21. The power conditioner 26 also has a control function for making the storage battery 29 and the fuel cell 30 stably operate. In addition, the power conditioner 26 distributes power to a charging outlet 33 which can be connected to the electrical vehicle 27. This makes it possible to charge and discharge the on-vehicle battery mounted on the electrical vehicle 27.

A home network 31 such as LAN (Local Area Network) is formed in the home 100. The HEMS executes energy management on the home 100 by using various types of data transmitted via the home network 31.

An HGW (Home Gateway) 13 is connected to the home network 31. The home gateway 13 is connected to an IP network 300, and can exchange information and data with a server apparatus 200 via the IP network 300. The home gateway 13 can communicate with the electrical energy meter 2, the distribution board 4, the power conditioner 26, and various types of electrical devices via the home network 31. Note that the home network 31 may be either a wired link or wireless link.

The home gateway 13 is a communication device which transmits various types of data to the server apparatus 200 and receives various types of data from the server apparatus 200. That is, the home gateway 13 is a computer including a CPU (Central Processing Unit). The home gateway 13 has a function of requesting the server apparatus 200 to provide various types of services and reflecting the will of the user in system control, in addition to the function of communicating with the server apparatus 200. These functions are implemented by programs stored in a nonvolatile memory or the like.

The home gateway 13 is connected to a terminal 32. The terminal 32 may be in a form like a touch panel or may be a general-purpose portable information device or personal computer. The terminal 32 displays the operational statuses or power consumptions of various types of electrical devices, the fuel cell 30, the storage battery 29, and the PV system 28 on an LCD (Liquid Crystal Display) or informs the user by audio guidance or the like. In addition, the terminal 32 includes an operation panel and receives various types of operation and setting inputs from the user.

The IP network 300 to which the home gateway 13 is connected is the so-called Internet or a VPN (Virtual Private Network) available from a system vendor. The home gateway 13 can communicate with the server apparatus 200 via the IP network 300 and can exchange data with a database (not shown).

As a communication protocol, it is possible to use ECHONET, ECHONET Lite, ZigBee, Z-Wave, KNX, or the like. As a lower communication layer, it is possible to use a wired LAN such as Ethernet, power line communication, wireless LAN, Bluetooth, or the like. Note that the IP network 300 can include a wireless or wired communication infrastructure for forming a two-way communication environment between the home gateway 13 and the server apparatus 200.

The home 100 includes a measuring unit 40 installed at a position near the feeding portion of the power grid 60. The position near the feeding port is, for example, a position inside the electrical energy meter 2, a power distribution portion of the electrical energy meter 2, the main or branch breaker of the distribution board 4, or the like. The measuring unit 40 includes a wireless interface and can communicate with the home gateway 13 via a wireless channel.

The measuring unit 40 is connected to the distribution line 21 and obtains current measurement data (current data) by measuring the current flowing in the distribution line 21. The measuring unit 40 also obtains voltage measurement data (voltage data) by measuring the voltage of the distribution line 21. Current data includes a instantaneous value of a current and a current waveform. Voltage data includes a instantaneous value of a voltage and a voltage waveform.

That is, the measuring unit 40 includes a current sensor for measuring a current in the distribution line 21 and a voltage sensor for measuring the voltage of the distribution line 21. In this embodiment, the current sensor obtains a current waveform by measuring current data at, for example, a sampling period of 100 μsec. Likewise, the voltage sensor obtains a voltage waveform by measuring voltage data at, for example, sampling period of 100 μsec.

Figure 2:
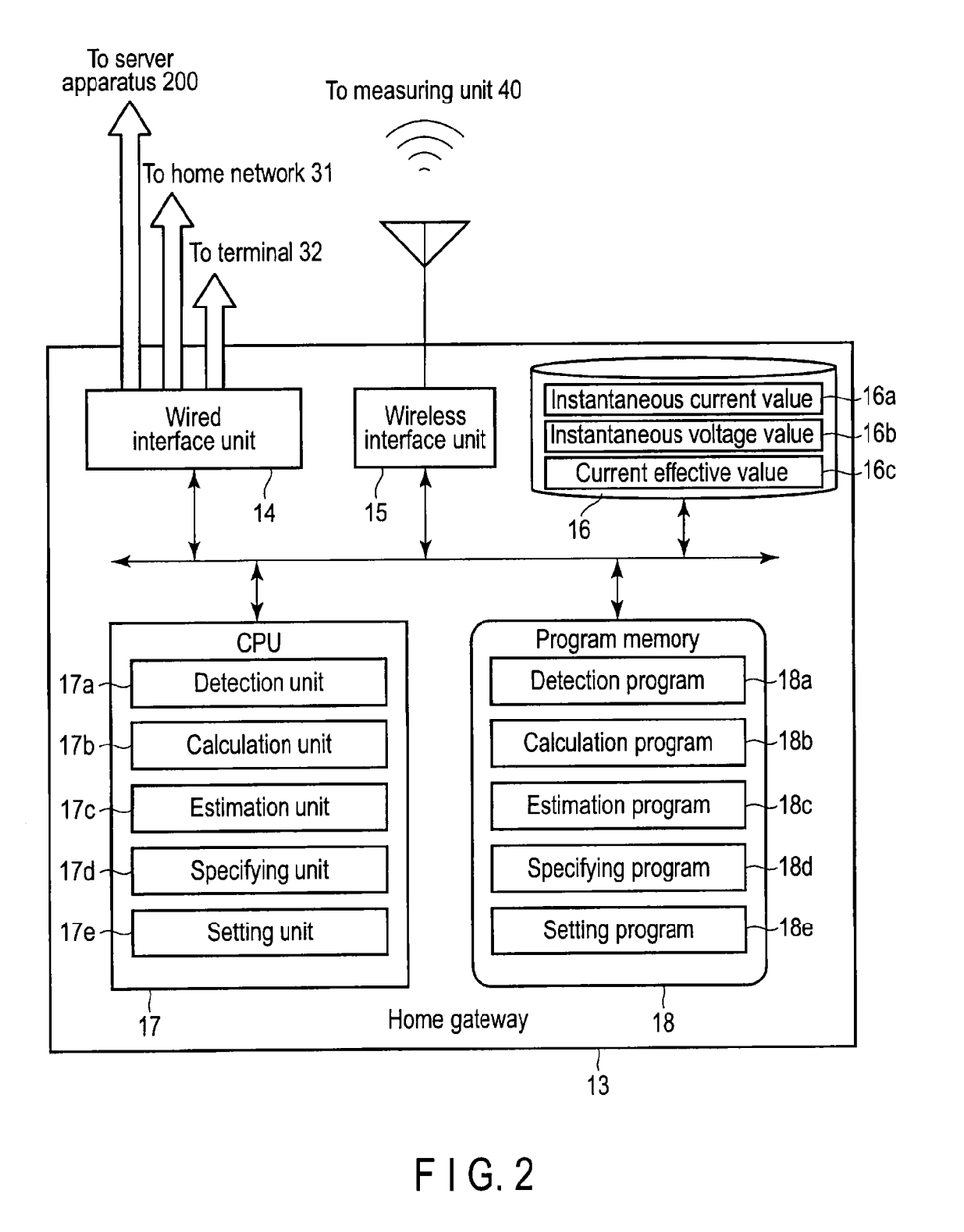
FIG. 2 is a functional block diagram showing an example of a home gateway 13 shown in FIG. 1.

FIG. 2 is a functional block diagram showing an example of the home gateway 13 shown in FIG. 1. The home gateway 13 includes a wired interface unit 14, a wireless interface unit 15, a storage unit 16, a CPU 17, and a program memory 18. The home gateway 13 is a computer made to function by causing the CPU 17 to execute the programs stored in the program memory 18.

The wired interface unit 14 is an interface for communicating with the IP network 300, the home network 31, and the terminal 32. The wireless interface unit 15 is an interface for communicating with the measuring unit 40. Obviously, the apparatus may perform all communications wirelessly.

The storage unit 16 is a memory device such as a semiconductor memory or HDD (Hard Disk Drive), and stores a momentary current value 16a (current waveform), a momentary voltage value 16b (voltage waveform), and a current effective value 16c obtained from the measuring unit 40.

The program memory 18 stores a detection program 18a, a calculation program 18b, an estimation program 18c, a specifying program 18d, and a setting program 18e as programs including instructions required for processing functions according to this embodiment. Note that the detection program 18a, the calculation program 18b, the estimation program 18c, the specifying program 18d, and the setting program 18e can be recorded on a removable medium (recording medium) such as a CD-ROM or can be downloaded via a communication line (including the IP network 300).

The CPU 17 reads out the respective programs from the program memory 18 and performs arithmetic processing by way of hardware, and includes, as its processing functions, a detection unit 17a, a calculation unit 17b, an estimation unit 17c, a specifying unit 17d, and a setting unit 17e.

The detection unit 17a acquires current data from the measuring unit 40 (FIG. 1), and detects the status change of any of the electrical devices based on the current data. That is, when the status of at least one of the plurality of electrical devices changes, the detection unit 17a detects a status change and outputs a signal indicating it. A status change includes, for example, ON/OFF switching, operation mode change [switching of air conditioning operations (cooling, heating, ventilating, dehumidifying, and the like), and a change in air conditioning temperature.

The calculation unit 17b calculates a current waveform change associated with a status change based on current data. The calculation unit 17b acquires voltage data from the measuring unit 40 and calculates a power change associated with a status change based on this voltage data and current data. The calculated data may be either a instantaneous value or effective value.

The estimation unit 17c estimates an electrical device candidate which has caused a status change based on a current waveform change. That is, the estimation unit 17c estimates at least one electrical device candidate from a current waveform change.

The specifying unit 17d specifies one electrical device of the estimated candidates based on a power change. That is, the specifying unit 17d specifies the electrical device which has caused the status change. The specifying unit 17d specifies the type of status change (ON/OFF switching, mode switching, or the like) while specifying the electrical device. This processing will be described in detail in this embodiment.

The setting unit 17e receives information required to specify an electrical device which has caused a status change or an input such as a set value. It is possible to input these pieces of information via the terminal 32. The setting unit 17e acquires various types of set data, thresholds, and the like via the wired interface unit 14 or the wireless interface unit 15. The storage unit 16 stores the acquired information. A plurality of embodiments will be described based on the above arrangement.

[First Embodiment]

Figure 3:
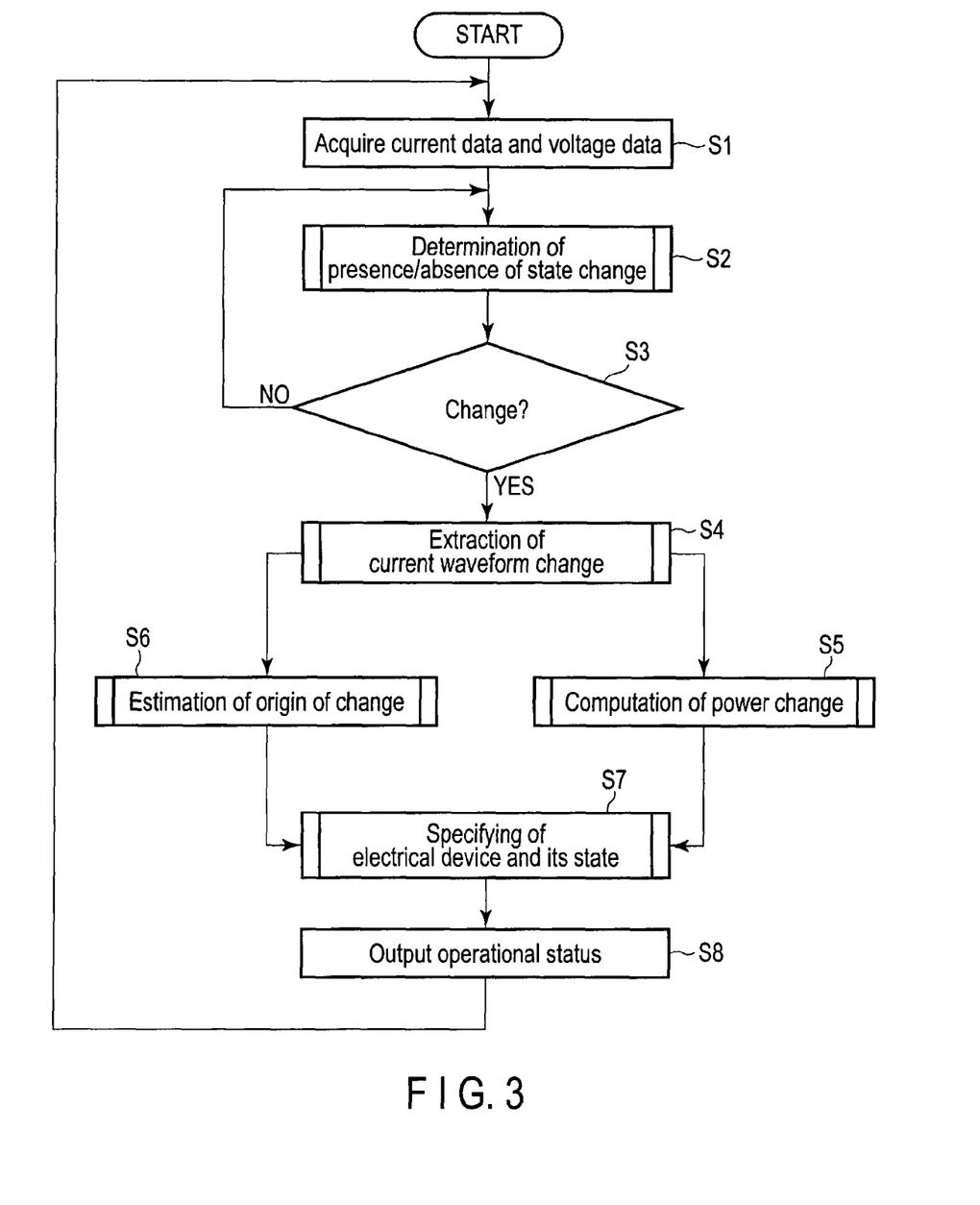
FIG. 3 is a flowchart showing an example of a processing procedure performed by the home gateway 13.

FIG. 3 is a flowchart showing an example of a processing procedure performed by a home gateway 13. The home gateway 13 acquires current data and voltage data from a measuring unit 40 (step S1). The home gateway 13 determines the presence/absence of a change in the status of an electrical device based on the acquired data (steps S2 and S3).

Upon detecting a status change (YES in step S3), the home gateway 13 obtains the difference between current changes before and after the status change and extracts a current waveform change (step S4). The home gateway 13 calculates a power change, i.e., the change amount of electrical energy consumed, based on the extracted change (step S5).

The home gateway 13 estimates an electrical device candidate which has contributed to the status change and a type candidate of the status change based on the current waveform change. That is, the home gateway 13 estimates an electrical device which has caused a status change and the type of status change, i.e., the origin of a status change (step S6).

The home gateway 13 specifies an electrical device which has caused a status change and type of status change based on a power change and the origin of the status change (step S7). The home gateway 13 then outputs an operational status after the change (step S8). The output result is informed to a terminal 32 and the like and is informed to the user by GUI (Graphical User Interface) display or the like. In addition, the specified electrical device and operational status are informed to a server apparatus 200 via an IP network 300 to be used for, for example, the calculation of an operation schedule for the electrical device.

Figure 4:
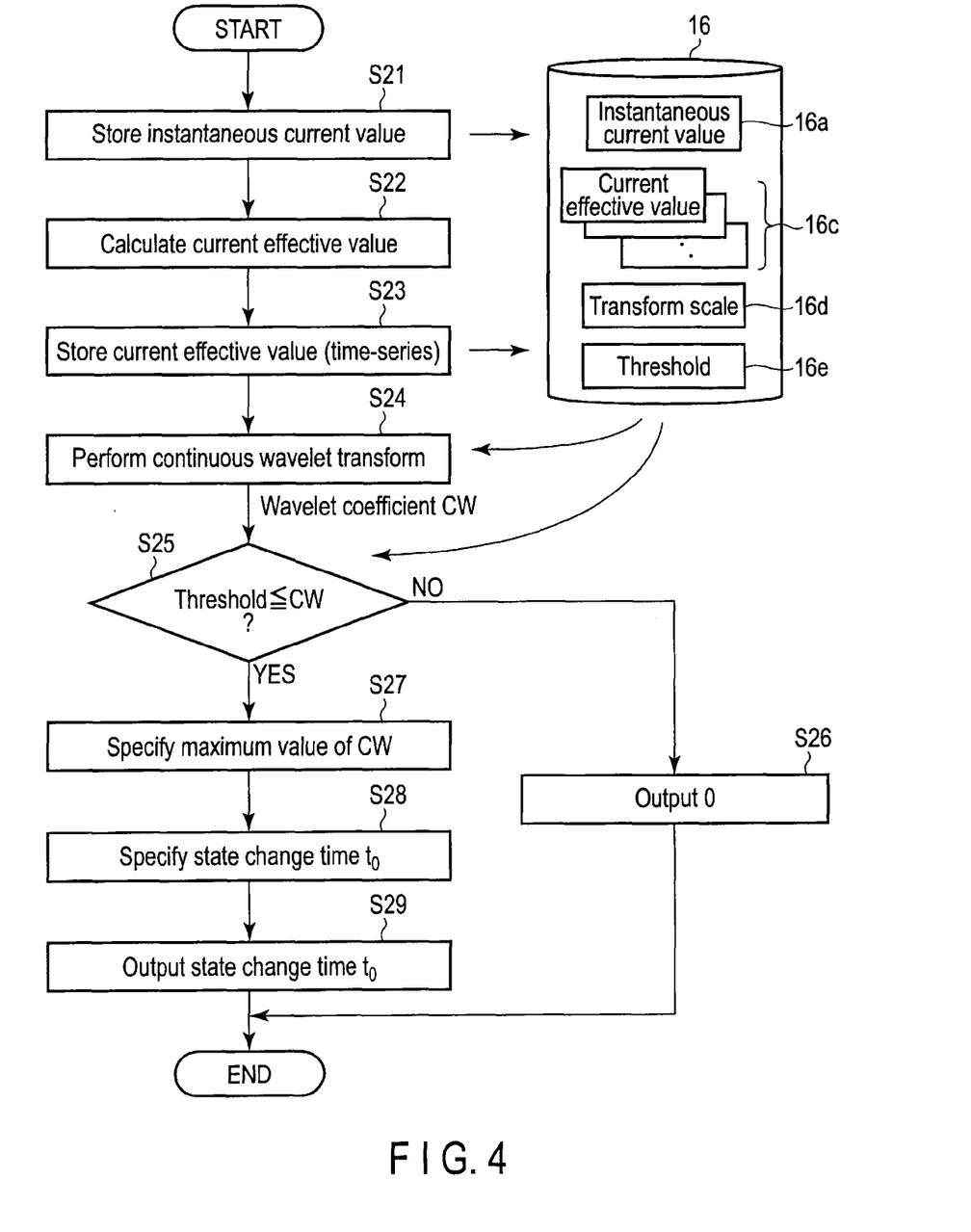
FIG. 4 is a flowchart showing an example of processing in step S2 shown in FIG. 3.

FIG. 4 is a flowchart showing an example of processing in step S2 shown in FIG. 3. The home gateway 13 stores a momentary current value including the acquired current data in a storage unit 16 (step S21). The home gateway 13 calculates, for example, a current effective value every second from the acquired current data (step S22). A storage unit 16b stores the time-series data of current effective values (step S23).

The home gateway 13 performs wavelet transform of the time-series data of the current effective values and outputs the resultant data as a wavelet coefficient CW (step S24). In this step, it is possible to use, for example, 1D Haar wavelet or 1D Daubechies wavelet.

When performing wavelet transform, it is necessary to provide a transform scale as a parameter. In this embodiment, the length of a transform scale (scale time) is determined in association with the length of a transition period of the status of an electrical device. That is, a scale time is set to a length including the transition period of the status of the electrical device. Recently, an increasing number of electrical devices are designed to execute various types of sequences at startup from switch ON. This requires a relatively long period of time of about 10 sec until the stabilization of the status. A transform scale is set to a minimum necessary length in consideration of this. A transform scale (denoted by reference numeral 16d) is set in advance by a setting unit 17e and stored in the storage unit 16.

A capacity corresponding to the time length of the transform scale 16d is ensured for each of the storage areas of a momentary current value 16a, the momentary voltage value 16b, and a current effective value 16c in the storage unit 16. A capacity corresponding to twice the transform scale 16d (transform scale 16d×2) is ensured for the momentary current value 16a, in particular.

The home gateway 13 compares the wavelet coefficient CW with a predetermined threshold (step S25). Note that a threshold (denoted by reference numeral 16e) is set in advance by the setting unit 17e and stored in the storage unit 16. If the wavelet coefficient CW is smaller than the threshold 16e, the home gateway 13 outputs 0 which indicates that there is no status change of the electrical device (step S26).

If the wavelet coefficient CW is equal to or larger than the threshold 16e, the home gateway 13 determines that there is a status change, and outputs a continuous wavelet coefficient CW. When a status change occurs, the continuous wavelet coefficient CW increases in a triangular waveform form with the lapse of time and eventually decreases to become equal to or smaller than the threshold. The home gateway 13 specifies the time corresponding to the maximum value of the continuous wavelet coefficient CW within the transform scale 16d (step S27), and determines that a status change has occurred at this time. That is, the home gateway 13 specifies the time when the continuous wavelet coefficient CW has reached the peak value as a status change time $t_0$ (step S28) and outputs it (step S29).

Figure 5:
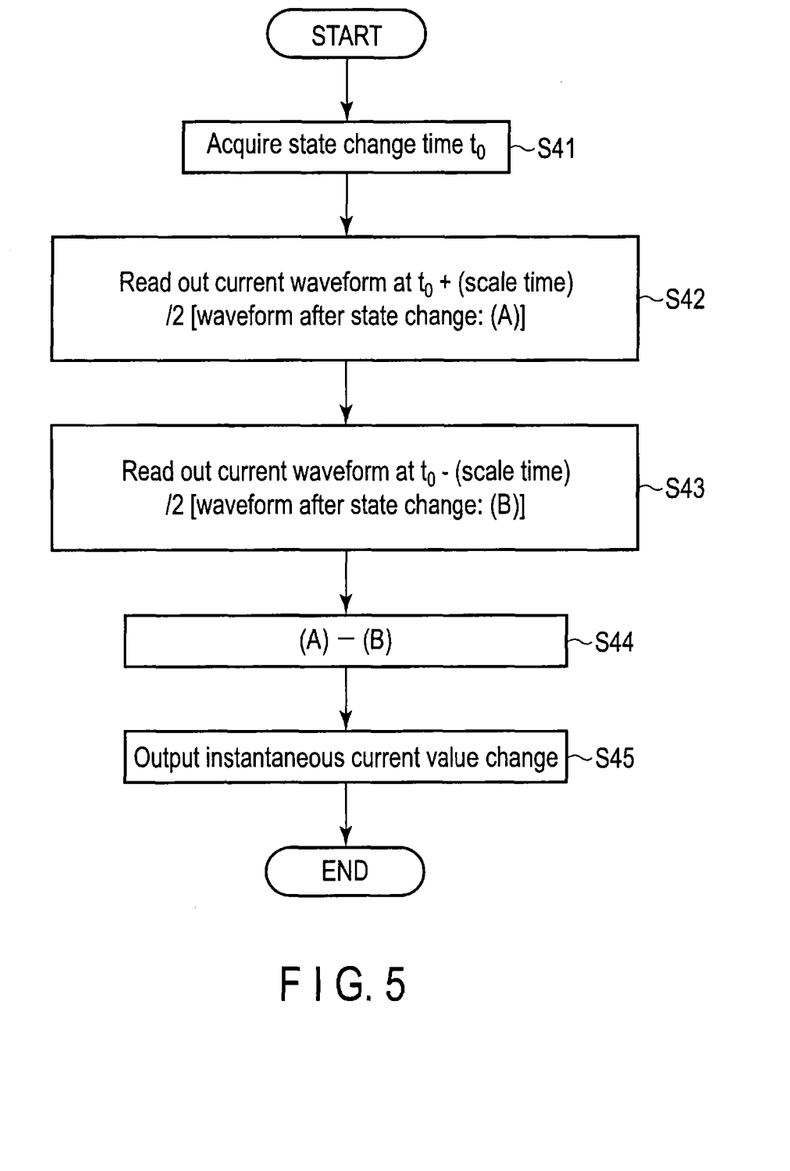
FIG. 5 is a flowchart showing an example of processing in step S4 shown in FIG. 3.

FIG. 5 is a flowchart showing an example of processing in step S4 shown in FIG. 3. First of all, the home gateway 13 acquires the status change time $t_0$ (step S41). The home gateway 13 then reads out voltage waveforms before and after the status change from the storage unit 16. More specifically, the home gateway 13 acquires waveforms at time points preceding and succeeding the status change time $t_0$ by (scale time)/2.

That is, the home gateway 13 reads out a current waveform at "$t_0$+(scale time)/2" as a waveform (A) after the status change (step S42), and reads out a current waveform at "$t_0$−(scale time)/2" as a waveform (B) (step S43). Assume that the scale time is the time length of the transform scale 16d. In this embodiment, the time length is 10 sec. That is, the home gateway 13 acquires waveforms at time points preceding and succeeding $t_0$ by 5 sec.

Figure 6:
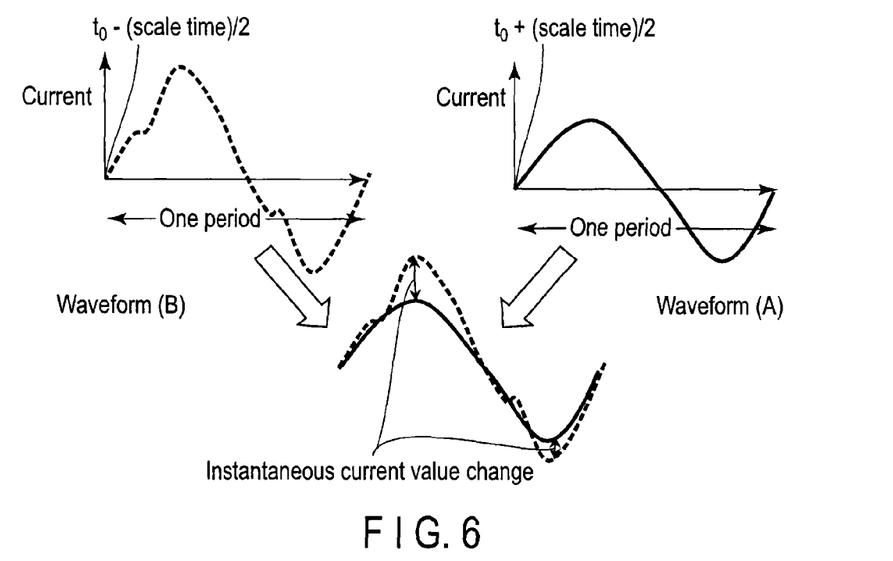
FIG. 6 is a view for explaining processing in extraction of a current waveform change.

The home gateway 13 then subtracts the waveform (B) from the waveform (A) as shown in FIG. 6 to extract a current waveform change, i.e., a momentary current value change (step S44). This momentary current value change is output for the next processing (step S45). Note that one period of the waveform shown in FIG. 6 corresponds to a period of commercial power, which is 20 msec in a 50 Hz area.

Figure 7:
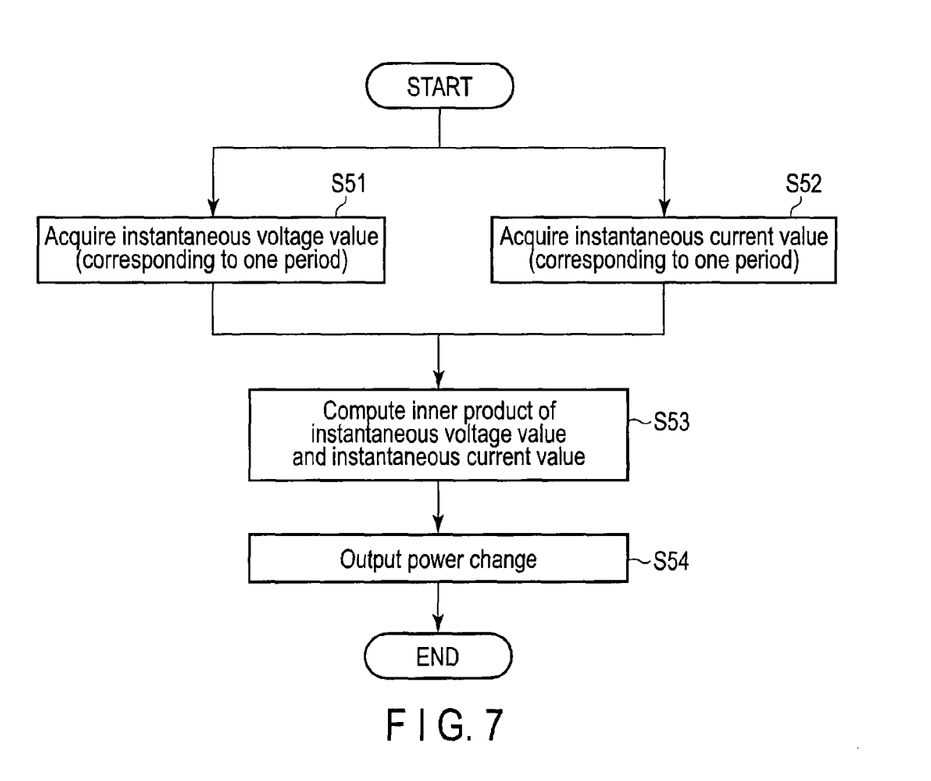
FIG. 7 is a flowchart showing an example of processing in step S5 shown in FIG. 3.

FIG. 7 is a flowchart showing an example of processing in step S5 shown in FIG. 3. The home gateway 13 reads out momentary voltage and current values (corresponding to one period) at status change time $t_0$ from the storage unit 16 (steps S51 and S52). The home gateway 13 obtains a power change by calculating the inner product of these instantaneous values (step S53) and outputs the resultant value (step S54). Performing inner product computation for the respective current and voltage waveforms can accurately evaluate even power with a waveform including many harmonic components.

Figure 8:
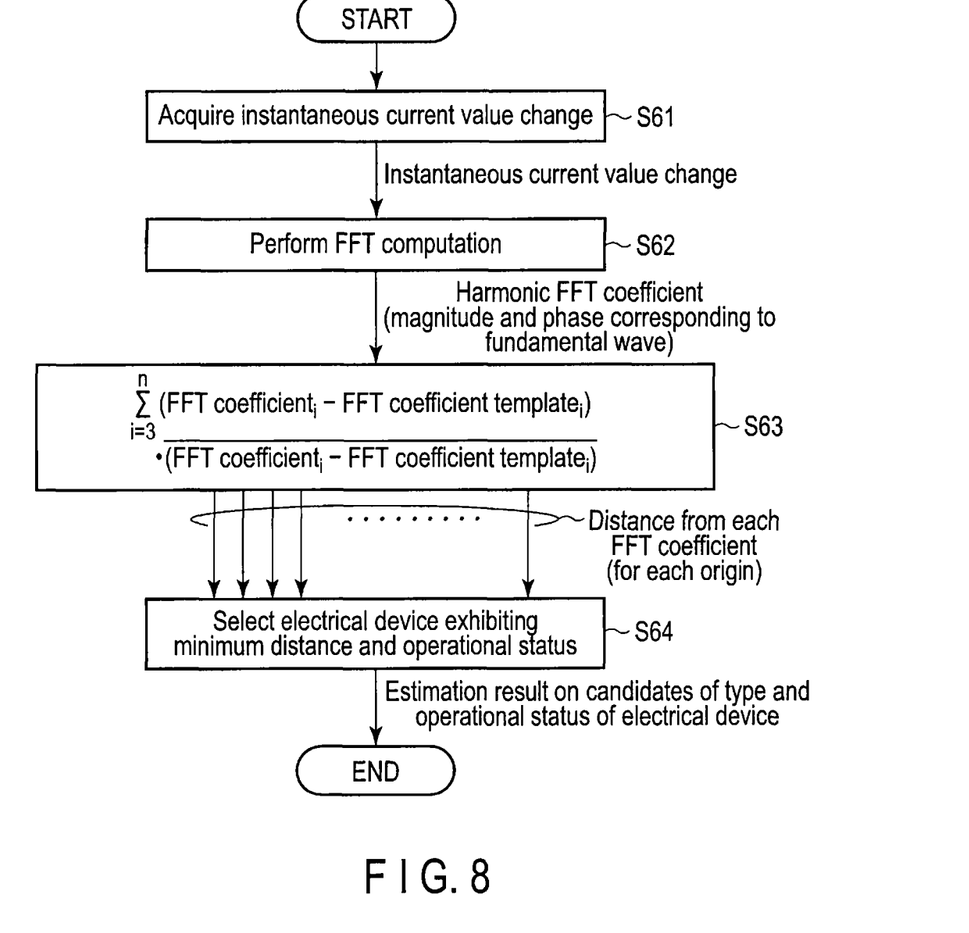
FIG. 8 is a flowchart showing an example of processing in step S6 shown in FIG. 3.

FIG. 8 is a flowchart showing an example of processing in step S6 shown in FIG. 3. The home gateway 13 acquires a momentary current value change at status change time $t_0$ (step S61). The home gateway 13 then performs FFT (Fast Fourier Transform) for the acquired momentary current value change (step S62) to calculate a harmonic FFT coefficient. This FFT coefficient includes a magnitude and a phase relative to the fundamental wave.

The home gateway 13 stores, in the storage unit 16, an FFT coefficient template which is a database associating FFT coefficients with the origins of status changes (the types of electrical devices which have caused status changes and the types of status changes) (not shown). The FFT coefficient template can include detailed information such as the models and makers of electrical devices. The FFT coefficients of the power supply units of home appliances having inverters (inverter facilities) have characteristic patterns as compared with home appliances having no inverters (non-inverter facilities). Using an FFT coefficient template therefore can accurately specify the model of an electrical device based on the characteristic of the power supply unit.

The home gateway 13 compares the FFT coefficient calculated in step S62 with the distance from the FFT coefficient for the origin of each status change (step S63). It is possible to calculate this distance according to, for example, the mathematical expression written in step S63. This expression is used to obtain the differences between calculated FFT values and template values for the respective harmonic orders (i=3 to n) and the respective real parts and complex conjugate parts and obtain the total sum of the products of the obtained values.

The home gateway 13 specifies the minimum value of the distances calculated for the respective origins and selects the origin corresponding to the minimum value (step S64). That is, the home gateway 13 selects the electrical device corresponding to the minimum distance and its operational status from the FFT coefficient template. The type and operational status of the selected electrical device are output as estimation results. That is, at this stage, candidates of the type and operational status of the electrical device are obtained.

Since an inverter facility includes a rectifying circuit unique to the power supply unit, it is possible to specify an inverter facility candidate with certain accuracy. On the other hand, in some case, the apparatus may specify a plurality of candidates for a non-inverter facility such as a toaster or electric pot.

Figure 9:
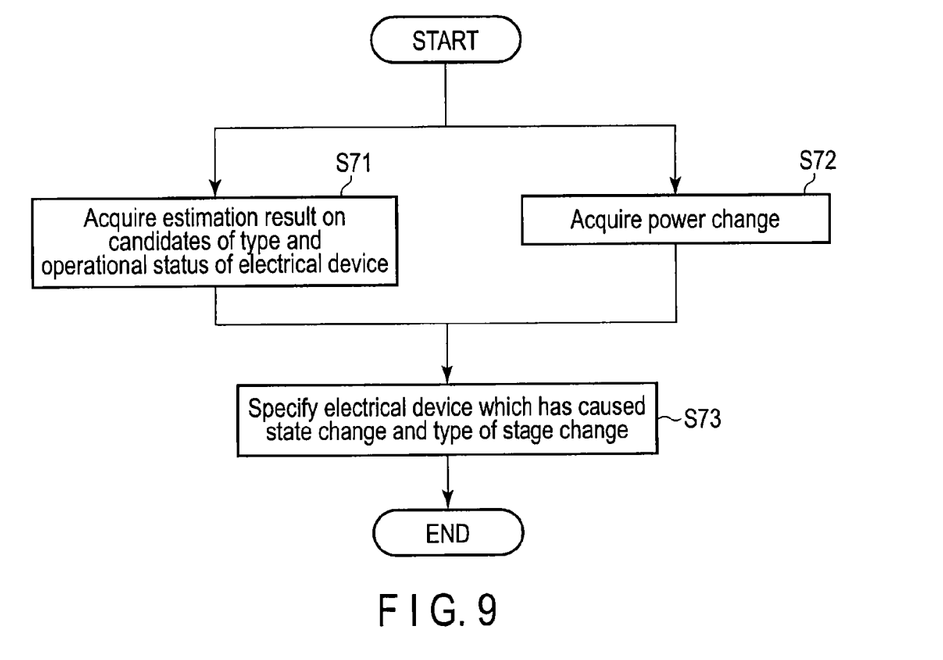
FIG. 9 is a flowchart showing an example of processing in step S7 shown in FIG. 3.

FIG. 9 is a flowchart showing an example of processing in step S7 shown in FIG. 3. The home gateway 13 acquires the candidates of the type and operational status of the electrical device estimated in step S64 (FIG. 8) (step S71). The home gateway 13 acquires the power change calculated in step S5 (FIG. 3) (step S72). The home gateway 13 then specifies the type and operational status of the electrical device from the candidates based on the power change (step S73).

In a case in which the status of an inverter facility has changed, since an almost accurate result can be obtained in step S64 in FIG. 8, the home gateway 13 confirms the estimation result based on the power change. In contrast to this, in a case in which the status of a non-inverter facility has changed, it is possible to specify an electrical device based on a power change width before and after the change and specify a status change. Any electrical device which has not been specified by the above procedure is determined as a device which has caused no status change. The status of this electrical device is held without any change at this time.

As described above, according to the first embodiment, the apparatus calculates the time-series data of current effective values based on the current waveform obtained by sensing the current in the power grid 60, and detects a status change of an electrical device by continuous wavelet transform. Upon detecting the status change, the apparatus calculates the difference between waveforms before and after the detection.

This difference waveform can be regarded as the one caused by the status change of only one electrical device. This is because it is thought that the statuses of a plurality of electrical devices cannot simultaneously change (at least on the msec order) in practice. That is, this embodiment can reliably narrow down to one electrical device as a specific target and execute the above arithmetic processing.

The apparatus then performs FFT analysis of a waveform change caused by one electrical device and specifies the electrical device which has caused the status change and the status change itself based on the comparison with an existing template. It is therefore possible to greatly reduce detection errors caused by noise and the like, as compared with the existing technique of collectively specifying a plurality of electrical devices, by performing harmonic analysis of a mixture of waveforms from a plurality of electrical devices.

In addition, it is possible to obtain much higher accuracy than the technique of monitoring only a power change or the technique based on the premise that a status is almost steady. The capability to specify even a device exhibiting a gradual fluctuation in power like an inverter facility is advantageous unique to this embodiment. This makes it possible to obtain merits, which other techniques cannot obtain, under an environment in which inverter facilities and non-inverter facilities coexist.

As described above, the first embodiment can specify the operational status of an electrical device without making it have a sensor or communication function, and can contribute to the visualization of home power consumption. In addition, since it is not necessary to prove any sensor for each electrical device, it is possible to achieve a reduction in cost. This can also reduce the information communication load and stabilize a communication network. Furthermore, this technique can contribute to the visualization of energy consumption in existing electrical devices.

As described above, the first embodiment can provide a status estimation apparatus which can accurately estimate the statuses of electrical devices, a status estimation method, and a program.

[Second Embodiment]

The first embodiment estimates the type and operational status of an electrical device by comparing a calculated FFT coefficient value with a template. The second embodiment uses a pattern recognition technique instead of this technique.

Figure 10:
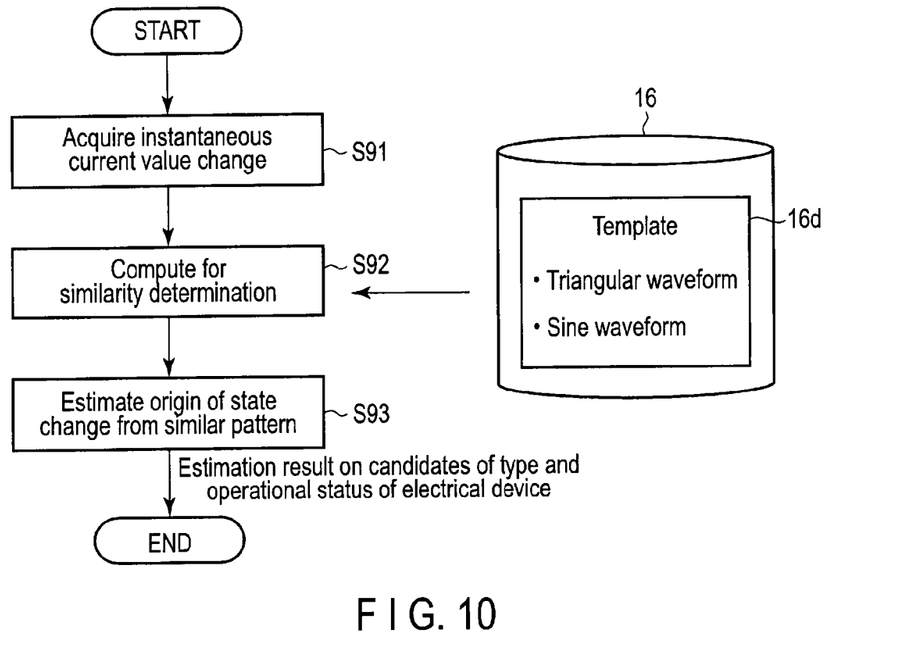
FIG. 10 is a flowchart showing an example of processing in step S6 shown in FIG. 3.

FIG. 10 is a flowchart showing an example of a processing procedure in the second embodiment. The flowchart shown in FIG. 10 shows another example of the processing in step S6 shown in FIG. 3.

A home gateway 13 acquires a momentary current value change at status change time $t_0$ (step S91). The home gateway 13 stores, in a storage unit 16, a template 16d including triangular waveforms and sine waveforms as characteristic waveforms appearing in the power supply units of inverter facilities in the form of a database.

The home gateway 13 performs computation to find which combination of a triangular waveform and a sine waveform in the template 16d is most similar to the momentary current value change (step S92), thereby extracting a similar pattern. The home gateway 13 then estimates candidates of the type and operational status of the electrical device which has caused the status change, based on the extracted similar pattern (step S93), and outputs the result.

The second embodiment estimates the type and operational status of an electrical device which has caused a status change by extracting a waveform characteristic by the pattern recognition technique based on a momentary current value change corresponding to one period of a sampling period of 100 μsec.

Outputs from the power supply circuits of many inverter facilities are waveforms obtained by combining pulse currents for correcting power factors and sine current waveforms proportional to current waveforms. A specific harmonic is sometimes superimposed on such a composite waveform. Therefore, using the pattern recognition technique disclosed in the second embodiment can accurately specify the power supply circuit of an inverter facility.

Obviously, it is possible to combine the pattern recognition technique in the second embodiment with harmonic analysis based on FFT computation described in the first embodiment. This can improve the accuracy of specifying an electrical device and its operational status and greatly increase the number of types of electrical devices which can be specified.

[Third Embodiment]

Figure 11:
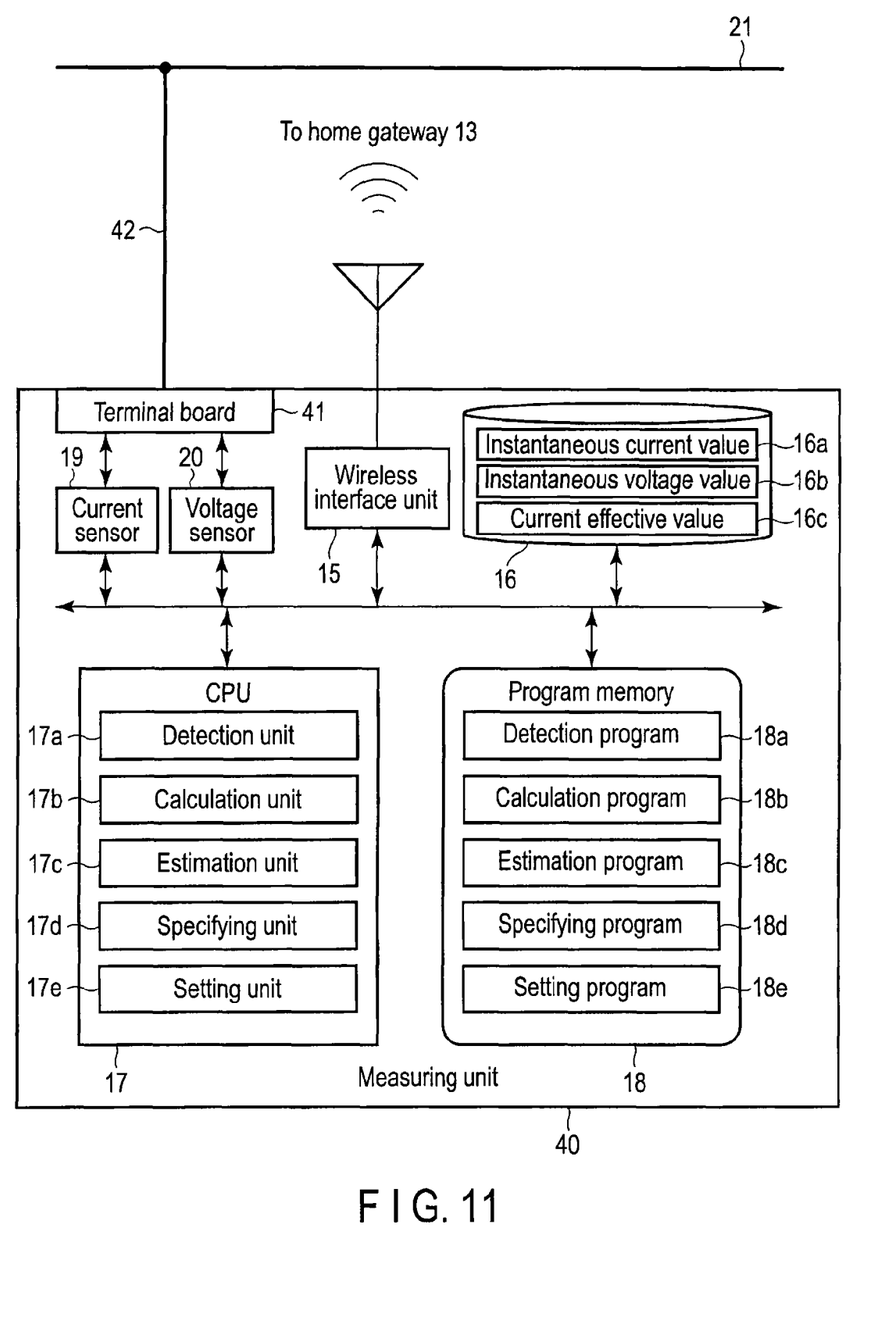
FIG. 11 is a functional block diagram showing an example of a measuring unit 40 according to the third embodiment.

FIG. 11 is a functional block diagram showing an example of a measuring unit 40 according to the third embodiment. The same reference numerals as in FIG. 2 denote the same components in FIG. 11, and only different portions will be described below. The third embodiment makes the measurement unit 40 have a function of specifying an electrical device and its operational status in addition to a sensor function.

Referring to FIG. 11, the measurement unit 40 includes a wireless interface unit 15 which communicates with a home gateway 13, a storage unit 16, a CPU 17, and a program memory 18, in addition to a current sensor 19 and a voltage sensor 20. The current sensor 19 and the voltage sensor 20 are connected to a distribution line 21 via a terminal board 41 and a probe 42, and respectively acquire current data and voltage data.

The third embodiment specifies an electrical device and its operational status in the same manner as in the first and second embodiments. The specified electrical device and status change are informed to the home gateway 13 by wireless communication and displayed on, for example, a terminal 32. Implementing the function according to this embodiment in the measurement unit 40 in this manner can also achieve the object.

Note that the present invention is not limited to the above embodiments. For example, the above embodiments have exemplified the processing based on current waveforms. However, the above argument also holds by using voltage waveforms.

In the above embodiments, a status change is detected by continuous wavelet transform. It is however possible to use discrete wavelet transform. Using discrete wavelet transform can perform fast computation with small resources at a certain sacrifice of accuracy. This is an unignorable merit in a built-in module in particular.

Figure 12A:
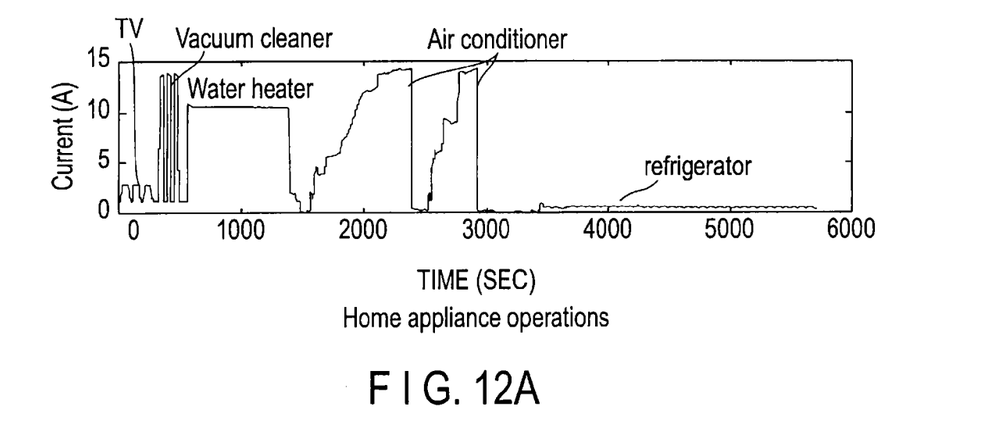
FIG. 12A shows the result obtained by monitoring changes in the operational statuses (currents) of electrical devices.
Figure 12B:
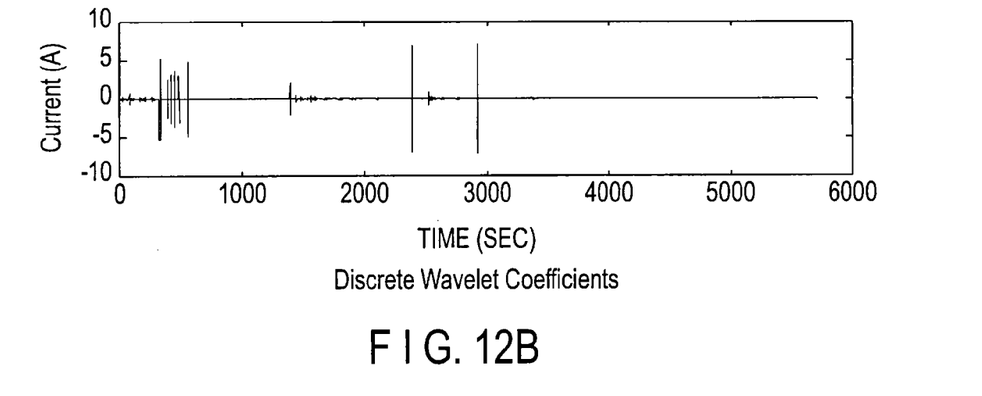
FIG. 12B shows the result obtained by extracting a current change by discrete wavelet transform.
Figure 12C:
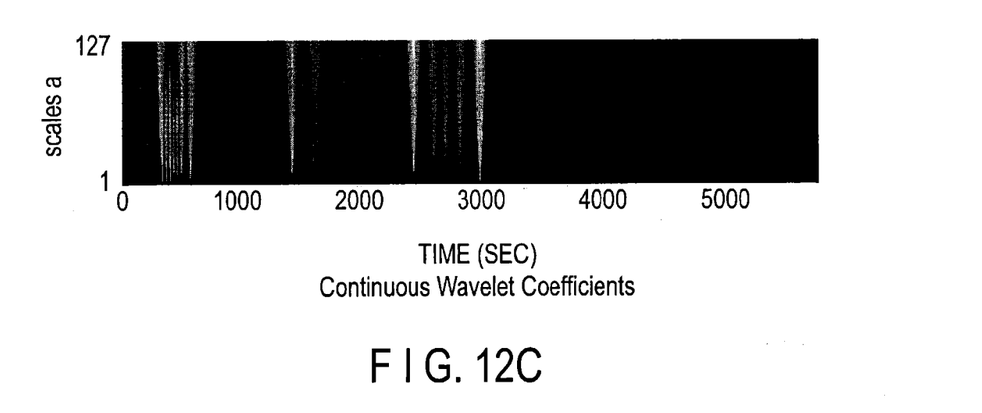
FIG. 12C shows the result obtained by extracting a current change by continuous wavelet transform.

FIG. 12A shows the result obtained by monitoring changes in the operational statuses (currents) of electrical devices. FIG. 12B shows the result obtained by extracting a current change by discrete wavelet transform. FIG. 12C shows the result obtained by extracting a current change by continuous wavelet transform.

FIG. 12C shows that all the ON/OFF switching operations are detected unlike the case shown in FIG. 12B, and hence indicates the superiority of continuous wavelet transform. However, discrete wavelet transform is more advantageous in terms of calculation speed. The user can arbitrarily decide which scheme greater importance should be attached in system design.

Some embodiments of the present invention have been described above. However, these embodiments are presented merely as examples and are not intended to restrict the scope of the invention. These novel embodiments can be carried out in various other forms, and various omissions, replacements, and alterations can be made without departing from the scope of the invention. These embodiments and their modifications are also incorporated in the spirit and scope of the invention as well as in the invention described in the claims and their equivalents.

The invention claimed is:

1. A status estimation apparatus comprising:
a detector configured to detect a status change of at least one electrical device based on measurement data of a current flowing in a distribution line that supplies power to the at least one electrical device;
a calculator configured to calculate a current waveform change and a power change that are associated with the status change based on the measurement data before and after the status change, upon detecting the status change;
an estimator configured to estimate an electrical device of the at least one electrical device that caused the status change and a type of the status change based on the current waveform change; and
a specifier configured to specify the electrical device that has caused the status change and the type of the status change based on the power change and an estimation result by the estimator, wherein
the detector specifies a status change time when the status change has occurred, and
the calculator extracts the current waveform change from a difference between current changes before and after the status change time.

2. The status estimation apparatus of claim 1, wherein the detector computes a current effective value based on the measurement data,
calculates a wavelet coefficient by performing continuous wavelet transform of time-series data of the current effective value, and
detects the status change if the wavelet coefficient is not less than an existing threshold.

3. The status estimation apparatus of claim 2, further comprising a setting unit configured to set a transform scale for the continuous wavelet transform and the threshold.

4. The status estimation apparatus of claim 2, wherein the detector sets a time corresponding to a maximum value of the wavelet coefficient in a transform scale for the continuous wavelet transform as a time at which the status change has occurred.

5. The status estimation apparatus of claim 1, wherein the estimator computes a harmonic distribution of the current waveform change, and
estimates the electrical device of the at least one electrical device that has caused the status change and the type of the status change based on the harmonic distribution.

6. The status estimation apparatus of claim 1, wherein the estimator performs pattern recognition of the current waveform change, and
estimates the electrical device of the at least one electrical device that has caused the status change and the type of the status change based on a result of the pattern recognition.

7. A status estimation method comprising:
detecting, by a computer, a status change of at least one electrical device based on measurement data of a current flowing in a distribution line that supplies power to the at least one electrical device;
calculating, by the computer, a current waveform change and a power change that are associated with the status change based on the measurement data before and after the status change, upon detecting the status change;
estimating, by the computer, an electrical device of the at least one electrical device that has caused the status change and a type of the status change based on the current waveform change; and
specifying, by the computer, the electrical device that has caused the status change and the type of the status change based on the power change and an estimation result of the electrical device of the at least one electrical device that has caused the status change and the type of the status change, wherein
the detecting of the status change of the at least one electrical device includes specifying a status change time when the status change has occurred, and
the calculating of the current waveform change and the power change includes extracting the current waveform change from a difference between current changes before and after the status change time.

8. The status estimation method of claim 7, wherein the detecting comprises computing a current effective value based on the measurement data,
calculating a wavelet coefficient by performing continuous wavelet transform of time-series data of the current effective value, and
detecting the status change if the wavelet coefficient is not less than an existing threshold.

9. The status estimation method of claim 8, wherein the detecting comprises setting a time corresponding to a maximum value of the wavelet coefficient in a transform scale for the continuous wavelet transform as a time at which the status change has occurred.

10. The status estimation method of claim 7, wherein the estimating comprises computing a harmonic distribution of the current waveform change, and
estimating the electrical device that has caused the state change and the type of the state change based on the harmonic distribution.

11. The status estimation method of claim 7, wherein the estimating comprises performing pattern recognition of the current waveform change, and
estimating the electrical device that has caused the state change and the type of the state change based on a result of the pattern recognition.

12. A non-transitory computer-readable medium storing a program executed by a computer, the program comprising:
detecting a status change of at least one of electrical device based on measurement data of a current flowing in a distribution line that supplies power to the at least one electrical device;
calculating a current waveform change and a power change that are associated with the status change based on the measurement data before and after the status change, upon detecting the status change;
estimating an electrical device that has caused the status change and a type of the status change based on the current waveform change; and
specifying the electrical device that has caused the status change and a type of the status change based on the power change and an estimation result of the electrical device that has caused the status change and the type of the status change, wherein
the detecting of the status change of the at least one electrical device includes specifying a status change time when the status change has occurred, and
the calculating of the current waveform change and the power change includes extracting the current waveform change from a difference between current changes before and after the status change time.

13. The medium of claim 12, wherein the detecting comprises computing a current effective value based on the measurement data,
calculating a wavelet coefficient by performing continuous wavelet transform of time-series data of the current effective value, and
detecting the status change if the wavelet coefficient is not less than an existing threshold.

14. The medium of claim 13, wherein the detecting comprises setting a time corresponding to a maximum value of the wavelet coefficient in a transform scale for the continuous wavelet transform as a time at which the status change has occurred.

15. The medium of claim 12, wherein the estimating comprises computing a harmonic distribution of the current waveform change, and
    estimating the electrical device that has caused a state change and a type of the state change based on the harmonic distribution.

16. The medium of claim 12, wherein the estimating comprises performing pattern recognition of the current waveform change, and
    estimating the electrical device that has caused a state change and a type of the state change based on a result of the pattern recognition.

* * * * *

UNITED STATES PATENT AND TRADEMARK OFFICE
CERTIFICATE OF CORRECTION

PATENT NO. : 9,638,723 B2
APPLICATION NO. : 14/031827
DATED : May 2, 2017
INVENTOR(S) : Yasuo Takagi et al.

It is certified that error appears in the above-identified patent and that said Letters Patent is hereby corrected as shown below:

On the Title Page

Item (63), the Related U.S. Application Data has been listed incorrectly. Item (63) should read:
-- Related U.S. Application Data
(63) Continuation of application No. PCT/JP2013/070221, filed on Jul. 25, 2013. --

Signed and Sealed this
Twenty-second Day of May, 2018

Andrei Iancu
*Director of the United States Patent and Trademark Office*